US009653679B1

(12) United States Patent
Annunziata et al.

(10) Patent No.: US 9,653,679 B1
(45) Date of Patent: May 16, 2017

(54) MAGNETORESISTIVE STRUCTURES WITH STRESSED LAYER

(71) Applicant: International Business Machines Corporation, Armonk, NY (US)

(72) Inventors: Anthony J. Annunziata, Stamford, CT (US); Chandrasekharan Kothandaraman, New York, NY (US); Gen P. Lauer, Yorktown Heights, NY (US); Adam M. Pyzyna, Cortlandt Manor, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/163,253

(22) Filed: May 24, 2016

Related U.S. Application Data

(62) Division of application No. 14/967,773, filed on Dec. 14, 2015.

(51) Int. Cl.
*H01L 29/82* (2006.01)
*H01L 43/08* (2006.01)
*H01L 43/02* (2006.01)
*H01L 43/12* (2006.01)

(52) U.S. Cl.
CPC .............. *H01L 43/08* (2013.01); *H01L 43/02* (2013.01); *H01L 43/12* (2013.01)

(58) Field of Classification Search
CPC ... H01L 27/222; H01L 27/224; H01L 27/228; H01L 43/08; H01L 43/12; H01L 21/02488; H01L 21/02491; H01L 21/76843; H01L 21/76846; H01L 29/82
See application file for complete search history.

(56) References Cited

U.S. PATENT DOCUMENTS

| | | | | |
|---|---|---|---|---|
| 7,071,564 B1* | 7/2006 | Erb | .................. | H01L 21/76843 257/704 |
| 2007/0155139 A1* | 7/2007 | Hecht | ............... | H01L 21/02488 438/486 |
| 2012/0306033 A1* | 12/2012 | Satoh | ................... | H01L 27/222 257/421 |

OTHER PUBLICATIONS

Annunziata, Anthony J., et al.; "Strained Magnetoresistive Structures"; U.S. Appl. No. 14/967,773, filed Dec. 14, 2015.
List of IBM Patents or Patent Applications Treated As Related—Date Filed: May 26, 2016; 1 page.

* cited by examiner

*Primary Examiner* — Duy T Nguyen
(74) *Attorney, Agent, or Firm* — Cantor Colburn LLP; Vazken Alexanian

(57) ABSTRACT

A method of making a magnetoresistive structure is disclosed. The method includes forming a pillar structure including a magnetic tunnel junction on a substrate that includes a first electrode, depositing a stressed layer onto a pillar structure sidewall, and depositing a second electrode above the magnetic tunnel junction.

18 Claims, 5 Drawing Sheets

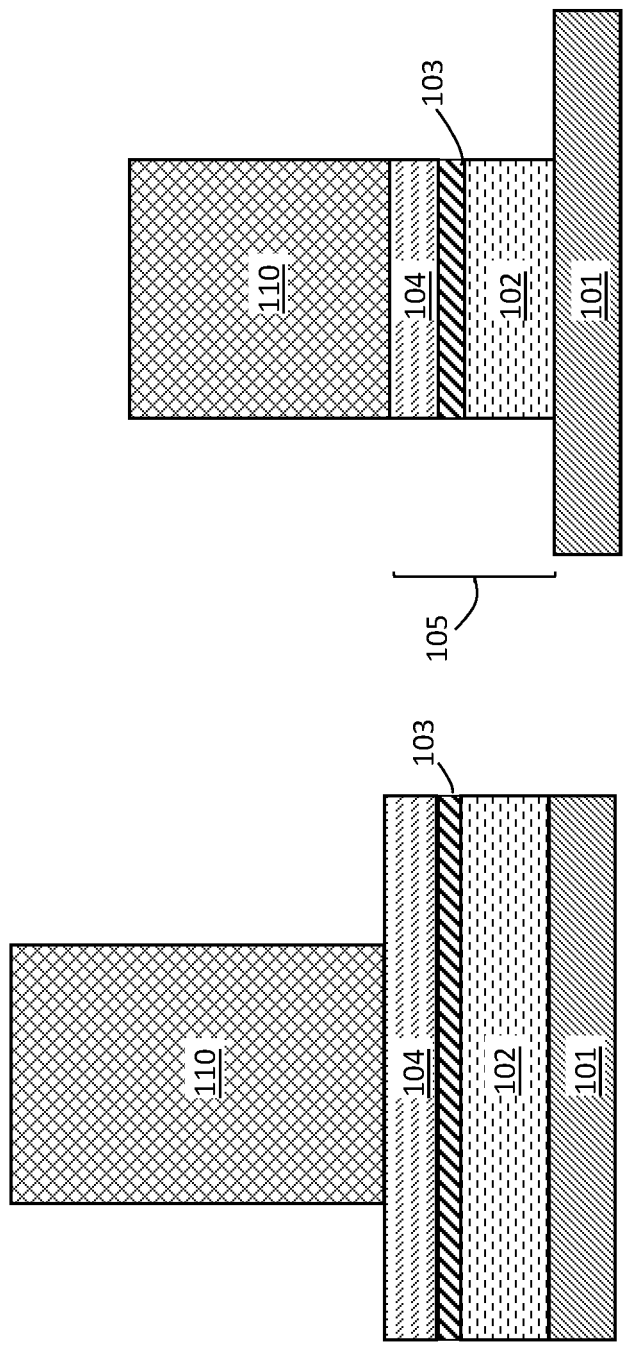

MAGNETORESISTIVE STRUCTURES WITH STRESSED LAYER

DOMESTIC PRIORITY

This application is a divisional of and claims priority from U.S. patent application Ser. No. 14/967,773, filed on Dec. 14, 2015, entitled "STRAINED MAGNETORESISTIVE STRUCTURES", the entire contents of which are incorporated herein by reference.

BACKGROUND

The present invention relates to magnetoresistive structures, and more specifically to magnetic tunnel junction (MTJ) stack structures such as used in spin-transfer torque magnetoresistive random access memory (STT-MRAM) devices.

A STT-MRAM device is a type of solid state, non-volatile memory that uses tunneling magnetoresistance (TMR or MR) to store information. MRAM includes an electrically connected array of magnetoresistive memory elements, referred to as magnetic tunnel junctions. Each MTJ includes a free layer and fixed/reference layer that each includes a magnetic material layer. The free and reference layers are separated by a non-magnetic insulating tunnel barrier. The free layer and the reference layer are magnetically decoupled by the tunnel barrier. The free layer has a variable magnetization direction, and the reference layer has an invariable magnetization direction.

An MTJ stores information by switching the magnetization state of the free layer. When the free layer's magnetization direction is parallel to the reference layer's magnetization direction, the MTJ is in a low resistance state. Conversely, when the free layer's magnetization direction is antiparallel to the reference layer's magnetization direction, the MTJ is in a high resistance state. The difference in resistance of the MTJ may be used to indicate a logical '1' or '0', thereby storing a bit of information. The TMR of an MTJ determines the difference in resistance between the high and low resistance states. A relatively high difference between the high and low resistance states facilitates read operations in the MRAM.

In order for STT-MRAM devices to be utilized in connection with semiconductor logic and memory chips, they are typically integrated into the semiconductor device manufacturing techniques.

SUMMARY

According to an embodiment of the present invention, a method of making a magnetoresistive structure comprises forming a pillar structure comprising a magnetic tunnel junction on a substrate that comprises a first electrode, depositing a stressed layer onto a pillar structure sidewall, and depositing a second electrode above the magnetic tunnel junction.

According to another embodiment, a method of making a magnetoresistive structure comprises depositing layers comprising a reference magnetic lower layer, a tunnel barrier layer, and a free magnetic upper layer onto a substrate comprising a first electrode. A patterned electrically conductive hard mask is deposited over the deposited layers, and the deposited layers are etched to form a preliminary pillar structure under the patterned hard mask. An interlayer dielectric material is deposited around the preliminary pillar structure and a trench is etched in the interlayer dielectric material adjacent to the preliminary pillar structure to form a pillar structure. An electrically conductive stressed layer is deposited onto the top and sidewall of the pillar structure. A second electrode is deposited onto the pillar structure.

According to another embodiment, a magnetorestrictive structure comprises a pillar structure is disposed on a substrate comprising a first electrode. The pillar structure comprises a magnetic tunnel junction that comprises a reference magnetic layer, a tunnel barrier layer, and a free magnetic layer. The pillar structure also comprises a hard mask above the magnetic tunnel junction. An interlayer dielectric is disposed around the pillar structure and a trench in the interlayer dielectric is adjacent to a sidewall of the pillar structure. A stressed electrically conductive layer is disposed on a sidewall of the pillar structure. A second electrode in disposed in the trench and above the hard mask.

BRIEF DESCRIPTION OF THE DRAWINGS

FIGS. 1A and 1B schematically depict the formation of a preliminary pillar structure, in which:

FIG. 1A is a cross-sectional side view of a patterned hard mask disposed on a magnetorestrictive multi-layer structure; and FIG. 1B is a cross-sectional side view of the multi-layer structure of FIG. 1A, after etching to form a preliminary pillar structure.

FIGS. 2A-2E schematically depict a stepwise formation of a magnetorestrictive structure, in which:

FIG. 2A is a cross-sectional side view of a patterned MTJ stack surrounded by an interlayer dielectric (ILD);

FIG. 2B is a cross-sectional side view of the patterned MTJ stack after etching a trench in the ILD layers;

FIG. 2C is a cross-sectional side view of the patterned MTJ stack after depositing a stressed layer in the trench; and FIG. 2D is a cross-sectional side view of the patterned MTJ stack after depositing an electrode material in the trench.

FIG. 2E is a cross-sectional of the patterned MTJ stack illustrating that a metal is deposited into the trench to form a top contact electrode.

FIGS. 3A, 3B, 3C, 3D and 3E schematically depict a stepwise formation of another magnetorestrictive structure, in which:

FIG. 3A is a cross-sectional side view of a patterned MTJ stack surrounded by an interlayer dielectric (ILD);

FIG. 3B is a cross-sectional side view of the patterned MTJ stack after etching a trench in the ILD layers, including formation of an electrically non-conductive stack sidewall layer;

FIG. 3C is a cross-sectional side view of the patterned MTJ stack after depositing a stressed layer in the trench; and FIG. 3D is a cross-sectional side view of the patterned MTJ stack after depositing an electrode material in the trench.

FIG. 3E is a cross-sectional side view of the patterned MTJ stack illustrating that a metal deposited into the trench to form a top contact electrode.

DETAILED DESCRIPTION

Figure 2C:
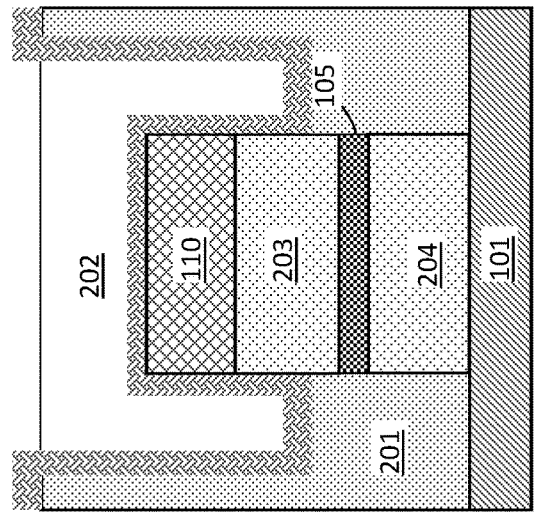

With reference now to FIGS. 1A and 1B, a preliminary pillar structure is formed by deposition of layers that make up a magnetic tunnel junction structure 105. As shown in FIG. 1A, the layers are disposed The MTJ stack 105 includes a magnetic reference layer 102, a tunnel barrier layer 103, and a magnetic free layer 104. The reference layer 102 and the free layer 104 include conductive, magnetic metals or metal alloys. Examples of materials for the magnetic reference layer 102 and magnetic free layer 104 include but are not limited to IrMn, PtMn, CoFe, CoFeB, Ru. Various ratios of these materials can be used (e.g., $Co_{40}Fe_{40}B_{20}$ as a type of CoFeB), Ru. Examples of materials for the tunnel barrier layer include but are not limited to MgO. The MTJ stack 105 is disposed on a contact electrode 101 (bottom contact). The reference layer 102 and free layer 104 can be formed by deposition process such as physical vapor deposition (PVD), ion beam deposition (IBD), atomic layer deposition (ALD), or other similar processes. In some embodiments, the tunnel barrier layer 103 can be formed, for example, by radio frequency deposition. The contact electrode can be part of a front end of line (FEOL) semiconductor structure that includes active substrate devices such as field effect transistors and other known devices (not shown). An electrically conductive etch stop layer (not shown) such as tantalum nitride can also be included on top of the electrode 101. A patterned hard mask 110 is disposed on the MTJ stack 105. The hard mask is typically formed from an etch-resistant material that is electrically conductive (e.g., tantalum nitride) in order to provide an electrical connection to a later-applied top contact electrode (FIG. 2E,), and can be applied PVD, IBD, or similar processes. Patterning of the hard mask can be accomplished by etching with ion beam etching (IBE) or a halogen-based chemical etching process. A soft mask (not shown) such as a patterned photoresist can optionally be included above the hard mask 101. In FIG. 1B, an etch process such as IBE or reactive ion etch (RIE) has been applied to etch the layers 102, 103, and 104 in areas outside the protection of the hard mask 110 to form a preliminary pillar structure comprising the MTJ 105.

Figure 2B:
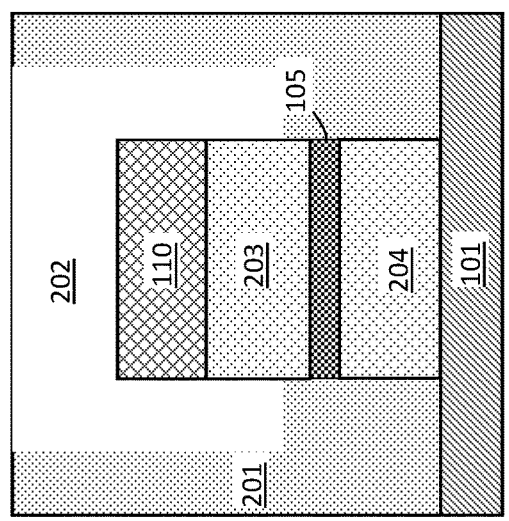
Figure 2A:
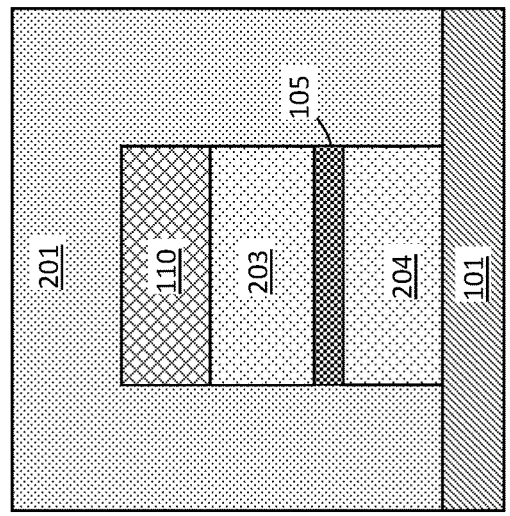

With reference now to FIGS. 2A-2E, a preliminary pillar structure is depicted similar to that of FIG. 1B, but with additional electrically conductive layers 203 and 204 in the pillar stack above and below the MTJ 105. Although conductive layers 203 and 204 are depicted as single layers, it is understood that they can each comprise a plurality of layers of different materials (e.g., Ru, Ta, Ag) as is known for magnetorestrictive structure configurations. With reference to FIG. 2A, an interlayer dielectric (ILD) material such as an oxide (e.g., silicon dioxide) is deposited around the preliminary pillar structure comprising the MTJ 105. In FIG. 2B, a portion of the ILD 201 is removed by an etching process such as ILB or RIE to remove the ILD 201 from around the pillar structure, forming a trench 202 as depicted in FIG. 2B. In FIG. 2C, a stressed layer 205 is applied onto the pillar structure sidewall and top, and on the surface of the ILD 201 (trench area 202 and top).

Figure 2E:
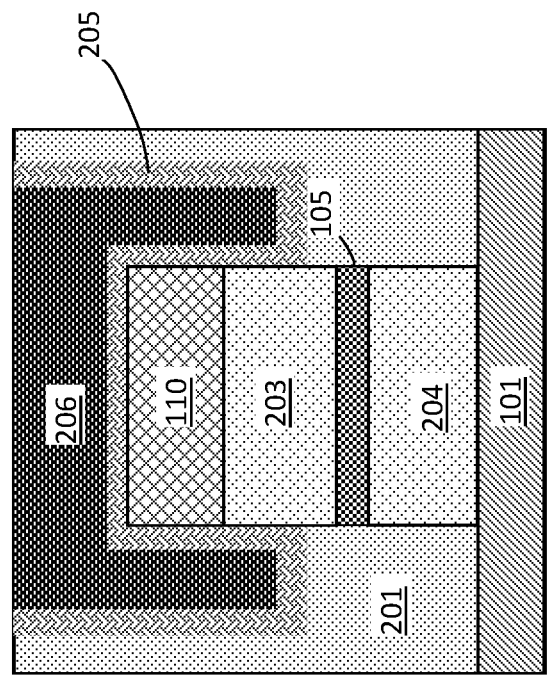

With continued reference to FIGS. 2B and 2C, a variety of different materials can be used for the stressed layer 205. In some embodiments, the stressed layer material is electrically conductive such as a metallic material or a doped semiconductor material. In some embodiments, the stressed layer material is electrically non-conductive; however, in that case a subsequent process must be employed to remove a portion of the stressed layer 205 (e.g., from the top of the hard mask 110) to open a contact for an top contact electrode (FIG. 2E). In some embodiments, the stressed layer has a residual stress of at least 200 MPa, more specifically 600 MPa, and more specifically at least 2 GPa. In some embodiments, the stressed layer is in a range having an upper limit of 200 MPa to more specifically 600 MPa, and more specifically at least 2 GPa. It is understood that the aforementioned lower and upper residual stress limits can be independently combined to form a number of different operable ranges of residual stress. In some embodiments, the stress is compressive. In some embodiments, the stress is tensile. Also, since the stress can be tensile or compressive, it is understood that residual stress values as used herein are absolute values independent of a ± sign. The stressed layer 205 can be applied with various techniques, including but not limited to sputtering, chemical vapor deposition, and atomic layer epitaxy. Materials for the stressed layer can be chosen for their residual stress properties upon deposition. Examples of materials for the stressed layer 205 include tantalum nitride, tantalum (including alpha tantalum and beta tantalum). In some embodiments, the stressed layer 205 comprises tantalum nitride. In some embodiments, the stressed layer comprises tantalum nitride and beta tantalum. In some embodiments, the stressed layer comprises a beta tantalum layer over a tantalum nitride layer.

With continued reference to FIGS. 2B and 2C, the depth of the trench etched into the ILD 201 determines the section of the pillar structure to which the stressed layer 205 is applied, and having a close proximity to the MTJ 205 or the magnetic free layer 104 can in some embodiments impart strain to the MTJ 205, which contribute and allow for control and engineering of magnetic anisotropy, and can in some embodiments provide increased barrier heights (retention) while preserving or improving the efficiency of STT-MRAM programming. In some embodiments, the trench has a depth that extends below the hard mask 110, as shown in FIGS. 2B and 2C. However, for embodiments such as depicted in FIG. 2C where the stressed layer is applied directly to the outer surface of the pillar structure, the use of a conductive material for the stressed layer 205 would result in a short circuit if it were applied adjacent to the MTJ 105, and in some embodiments the stressed layer is applied to a depth below that of the hard mask 110 and above that of the MTJ 105 as shown in FIG. 2C.

Figure 2D:
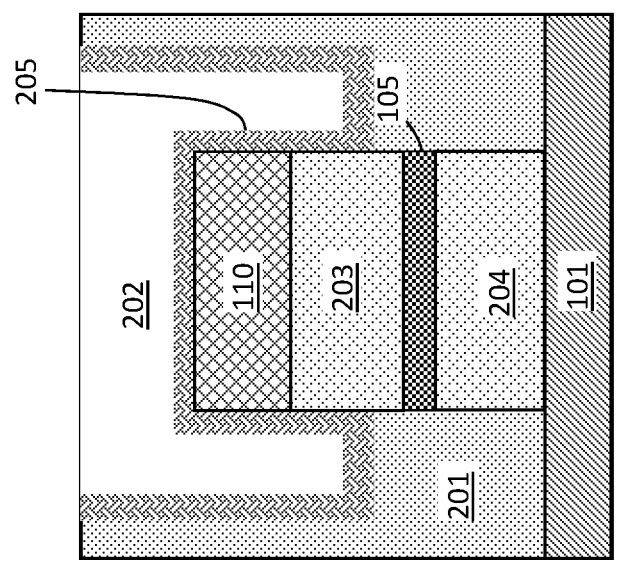
Figure 3C:
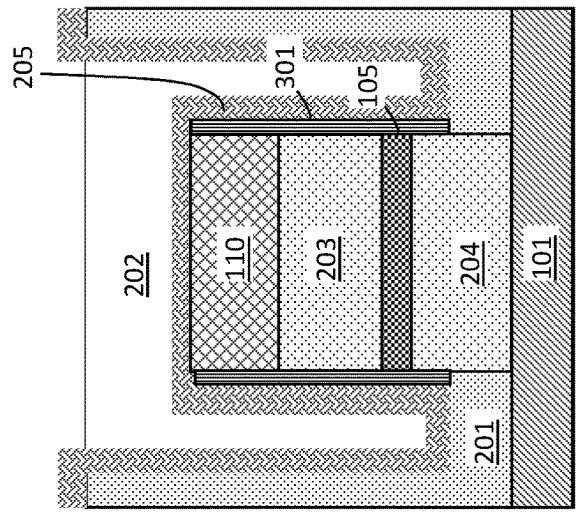
Figure 3B:
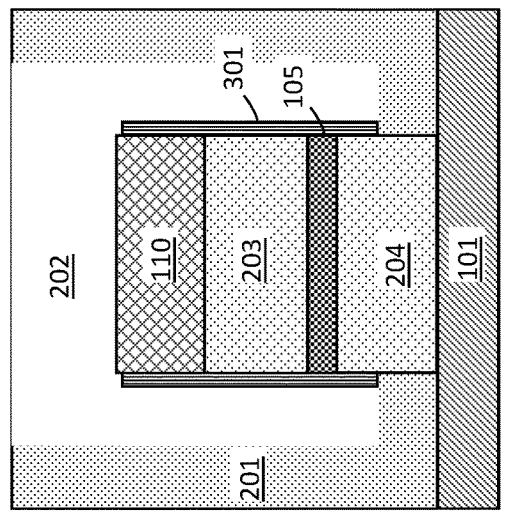
Figure 3A:
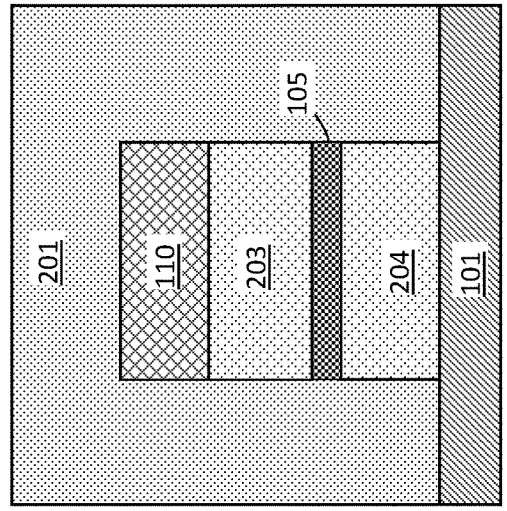
Figure 3E:
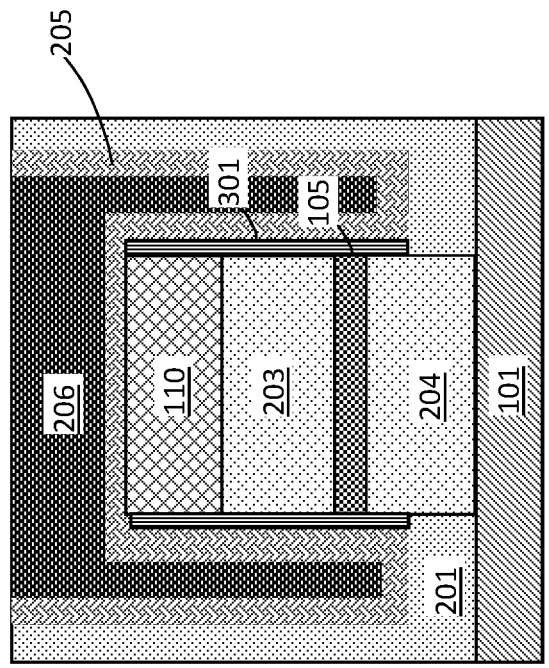
Figure 3D:
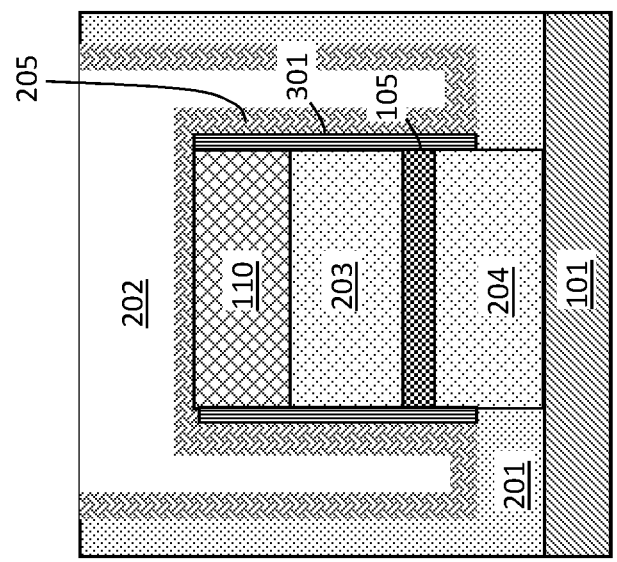

Turning now to FIG. 2D, the portion of the stressed layer 205 on top of the ILD 201 is removed, for example by chemical mechanical polishing (CMP). This prevents a conductive material in the stressed layer 205 from providing a bridge to adjacent magnetoresistive device structures (not shown). In FIG. 2E, a metal (e.g., copper) is deposited into the trench 202 to form a top contact electrode 206.

With reference now to FIGS. 3A-3E, and more specifically to FIGS. 3B-3E, in some embodiments, the pillar structure can have an electrically non-conductive layer 301 on a sidewall thereof. The electrically non-conductive layer can be residual material from the ILD 201 left behind after etching of the trench 202 or can be a separately applied spacer layer of an etch-resistant material (e.g., silicon nitride) applied before deposition of the ILD 201. A separately applied layer 301 can be formed by performing a deposition process, for example, plasma enhanced chemical vapor deposition (PECVD), CVD, PVD, IBD, or other like processes. Non-limiting examples of materials for a separately-applied layer 301 include silicon nitride, aluminum oxide ($Al_2O_3$), amorphous carbon (a-C), silicon SiBCN, SiOCN, or any combination thereof.

With an electrically non-conducting sidewall layer such as layer 301 in place to prevent shorting of the MTJ device from an electrically conductive stressed layer 205, the trench 202 (and application of the stressed layer 205) can extend down to the a section of the pillar sidewall adjacent to the free layer 104 of the MTJ 205 as shown in FIGS. 3B-3E. In some embodiments, this can provide greater levels of strain to the MTJ 205, further enhancing the above-described beneficial effects on retention or programming efficiency or both. Other features and processes besides the depth of trench 202 and the coverage of the stressed layer 205 are the same or similar in FIGS. 3A-3E as in FIGS. 2A-2E.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A magnetorestrictive structure, comprising
a pillar structure comprising a magnetic tunnel junction that comprises a reference magnetic layer, a tunnel barrier layer, and a free magnetic layer, and a hard mask layer above the magnetic tunnel junction, the pillar structure disposed on a substrate comprising a first electrode wherein the pillar structure further comprises an electrically non-conductive sidewall layer over the magnetic tunnel junction;
an interlayer dielectric around the pillar structure and a trench in the interlayer dielectric adjacent to a sidewall of the pillar structure;
a stressed electrically conductive layer on the sidewall of the pillar structure, wherein the stressed electrically conductive layer covers and extends below the hard mask layer without covering a side of the magnetic tunnel junction, the stressed electrically conductive layer being in direct contact with sides of the electrically non-conductive sidewall layer; and
a second electrode disposed in the trench and above the hard mask layer.

2. The structure of claim 1, wherein the pillar structure further comprises one or more electrically conductive layers between the magnetic tunnel junction and the hard mask layer.

3. The structure of claim 1, wherein the stressed electrically conductive layer covers the electrically non-conductive sidewall layer over the magnetic tunnel junction.

4. The structure of claim 1, wherein the stressed electrically conductive layer comprises a layer comprising tantalum nitride and a layer comprising beta phase tantalum.

5. The structure of claim 1, wherein the stressed electrically conductive layer has a residual stress of at least 200 MPa.

6. The structure of claim 1, wherein the stressed electrically conductive layer has a residual stress of 200 MPa to 2 GPa.

7. The structure of claim 1, wherein the stressed electrically conductive layer comprises a metallic layer.

8. The structure of claim 7, wherein the stressed electrically conductive layer comprises tantalum nitride or beta phase tantalum.

9. A magnetorestrictive structure, comprising
a pillar structure comprising a magnetic tunnel junction that comprises a reference magnetic layer, a tunnel barrier layer, and a free magnetic layer, and a hard mask layer above the magnetic tunnel junction, the pillar structure disposed on a substrate comprising a first electrode;
an interlayer dielectric around the pillar structure and a trench in the interlayer dielectric adjacent to a sidewall of the pillar structure;
an electrically non-conductive sidewall layer on the sidewall of the pillar structure;
a stressed electrically conductive layer on the electrically non-conductive sidewall layer, wherein the stressed electrically conductive layer covers entire sides of the electrically non-conductive sidewall layer and covers a top of the hard mask layer; and
a second electrode disposed in the trench and above the hard mask layer.

10. The structure of claim 9, wherein the pillar structure further comprises one or more electrically conductive layers between the magnetic tunnel junction and the hard mask layer.

11. The structure of claim 9, wherein the stressed electrically conductive layer covers and extends below the hard mask layer.

12. The structure of claim 11, wherein the electrically non-conductive sidewall on the sidewall of over the magnetic tunnel junction.

13. The structure of claim 12, wherein the stressed electrically conductive layer covers the electrically non-conductive sidewall layer on the sidewall of over the magnetic tunnel junction such that the electrically non-conductive sidewall layer electrically protects the magnetic tunnel junction from the stressed electrically conductive layer.

14. The structure of claim 9, wherein the stressed electrically conductive layer comprises a layer comprising tantalum nitride and a layer comprising beta phase tantalum.

15. The structure of claim 9, wherein the stressed electrically conductive layer has a residual stress of at least 200 MPa.

16. The structure of claim 9, wherein the stressed electrically conductive layer has a residual stress of 200 MPa to 2 GPa.

17. The structure of claim 9, wherein the stressed electrically conductive layer comprises a metallic layer.

18. The structure of claim 17, wherein the stressed electrically conductive layer comprises tantalum nitride or beta phase tantalum.

* * * * *